US007923748B2

(12) United States Patent
Ruffin

(10) Patent No.: US 7,923,748 B2
(45) Date of Patent: Apr. 12, 2011

(54) INTEGRATED LED HEAT SINK

(75) Inventor: Marvin Ruffin, Chicago, IL (US)

(73) Assignee: Excelitas Technologies LED Solutions, Inc., Wheeling, IL (US)

( * ) Notice: Subject to any disclaimer, the term of this patent is extended or adjusted under 35 U.S.C. 154(b) by 0 days.

(21) Appl. No.: 12/649,631

(22) Filed: Dec. 30, 2009

(65) Prior Publication Data

US 2010/0149818 A1 Jun. 17, 2010

Related U.S. Application Data

(62) Division of application No. 10/645,474, filed on Aug. 21, 2003, now Pat. No. 7,679,096.

(51) Int. Cl.
*H01L 29/26* (2006.01)

(52) U.S. Cl. .......................... 257/99; 257/720; 362/373

(58) Field of Classification Search .................... 257/79, 257/98, 99, 720

See application file for complete search history.

(56) References Cited

U.S. PATENT DOCUMENTS

| | | | | |
|---|---|---|---|---|
| 349,060 A * | 9/1886 | Serve | ............................ | 165/179 |
| 4,535,384 A * | 8/1985 | Wakabayashi et al. | ........ | 361/718 |
| 4,890,152 A * | 12/1989 | Hirata et al. | .................. | 257/666 |
| 6,541,800 B2 * | 4/2003 | Barnett et al. | .................. | 257/98 |
| 6,864,513 B2 * | 3/2005 | Lin et al. | .......................... | 257/99 |
| 2004/0004435 A1 * | 1/2004 | Hsu | .............................. | 313/512 |

* cited by examiner

*Primary Examiner* — Leonardo Andújar
(74) *Attorney, Agent, or Firm* — Mayer Brown LLP

(57) ABSTRACT

A heat sink for use with a high output LED light source is disclosed. The heat sink is used with an LED and conical reflector. The heat sink has a cylindrical back end holding the light emitting diode. The heat sink includes a conically shaped wall having an inner and outer surface and an open front end. The open front end has a rim with notches. The reflector has a front flat surface with arms which are fixed in the notches with a fastener. The heat sink includes a plurality of slits formed on the inner and outer surfaces extending between the back and front ends. A plurality of vanes extend radially from the inner surface. The heat sink is fabricated from a thermally conductive material. The conical shape of the heat sink, the slits and vanes increases exposed surface area to assist in dissipating heat generated from the LED.

12 Claims, 3 Drawing Sheets

INTEGRATED LED HEAT SINK

This application is a divisional of co-pending U.S. patent application Ser. No. 10/645,474, filed Aug. 21, 2003, and titled "Improved Integrated LED Heat Sink," the content of which is hereby incorporated by reference into this application.

FIELD OF INVENTION

Embodiments of the present invention relate generally to the field of light emitting diodes. More specifically, embodiments of the present invention are directed to an integrated heat sink allowing the use of high power light emitting diodes for various lighting applications.

BACKGROUND OF INVENTION

Light emitting diodes (LEDs) are well known solid state light sources. LEDs have many advantages over traditional sources such as incandescent bulbs as they are cheaper to produce, more robust, and require less power LEDs are especially desirable as they emit light with high power efficiency over specific colors in the spectrum. However, LEDs suffer from relatively low light output since higher light output requires greater energy input resulting in greater heat. Since an LED is a semi-conductor device, the greater heat effects the semi-conductor characteristics of the LED. Relatively high heat levels may cause a degradation of performance in the form of unpredictable light loss or worse a catastrophic break down in the semi-conductor material resulting in failure of the LED.

However there are many applications which require high light output. Presently, specialized devices such as halogen bulbs are used in such applications. Halogen bulbs have the advantage of producing intense light over selected spectrums of light with high energy input. Since halogen bulbs operate at 6500 degrees F. or greater, heat dissipation is not an issue with regard to operation. Such applications are useful in the fields of automotive, medical, industrial and architectural lighting. However, halogen bulbs suffer from reliability problems in that their useful life is relatively short necessitating periodic replacement. Furthermore, halogen bulbs require large amounts of energy and do not efficiently convert input energy into light output. Also, halogen lamps are restricted to light in the white spectrum, in order to create light in other colors, a filter must be used which decreases the effective power of the lamp.

Thus, there is a need for a heat sink which will allow the use of high light output from an LED. There is a further need for an LED lighting system which provides the high output without risking failure from excessive heat. There is also a need for a heat sink which allows the use of more energy efficient LEDs in high output applications.

SUMMARY OF THE INVENTION

These needs and others may be met by the present invention, one example of which is a high output light emitting diode based light source. The light source has a light emitting diode and a heat sink. The heat sink has a base supporting the light emitting diode and a wall having an inner surface facing the light emitting diode and an outer surface. The inner and outer surfaces are exposed to dissipate heat generated by the light emitting diode.

Another example of the invention is a heat sink for use in conjunction with a light emitting diode light source. The heat sink includes a base member having electrical connections.

The heat sink also has a generally conically shaped wall having an outer surface, an inner surface, a back end having a mounting aperture for a light emitting diode and an opposite open front end.

Another example of the invention is a high power light emitting diode lamp having a light emitting diode and a heat sink. The heat sink has a cylindrical back end holding the light emitting diode and a conically shaped wall having an inner and outer surface. The heat sink has an open front end and a plurality of slits formed on the inner and outer surfaces extending between the back and front ends. The heat sink also has a plurality of vanes extending radially from the inner surface. A clear reflector covers the light emitting diode and has a conical body with a front flat circular surface with a plurality of arms extending from the surface in contact with the front end of the heat sink.

It is to be understood that both the foregoing general description and the following detailed description are not limiting but are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

BRIEF DESCRIPTION OF DRAWINGS

These and further aspects and advantages of the invention will be discussed more in detail hereinafter with reference to the disclosure of preferred embodiments, and in particular with reference to the appended Figures wherein.

DESCRIPTION OF THE PREFERRED EMBODIMENT

Figure 1:
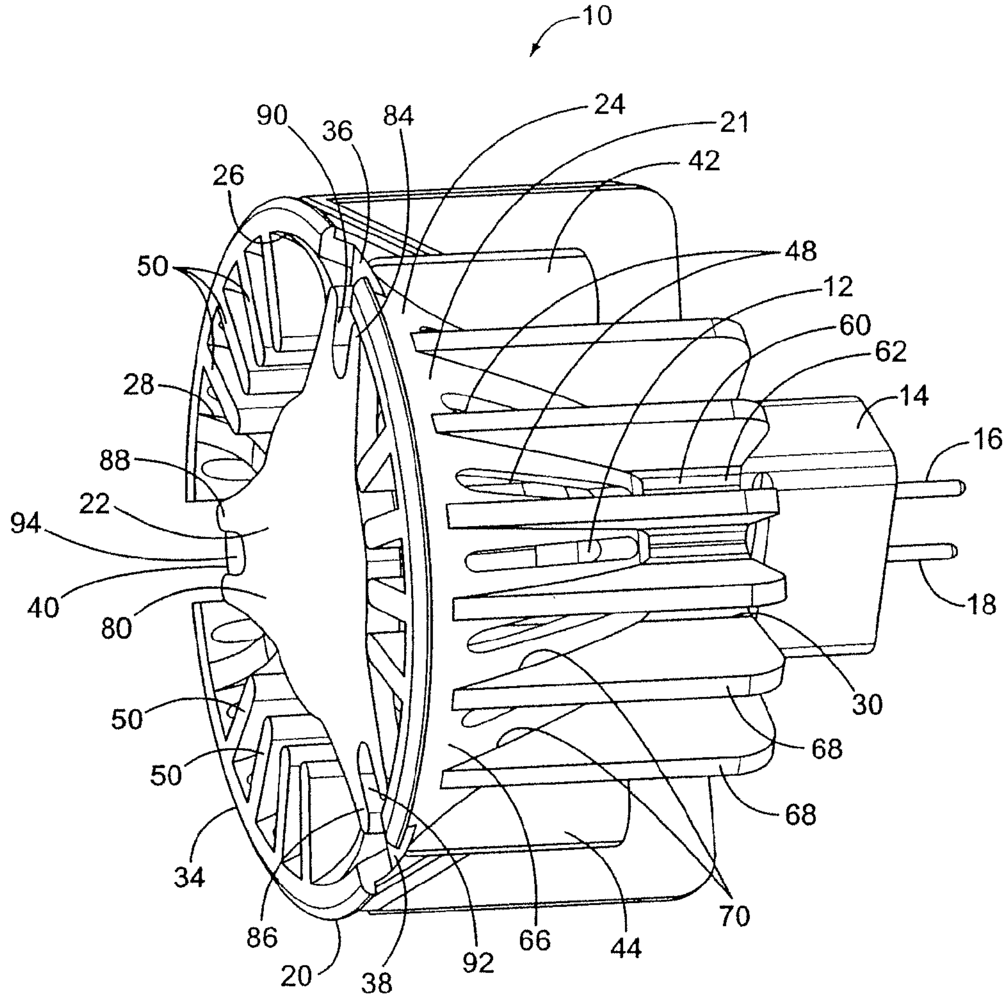
FIG. 1 is a perspective view of a lighting device using the improved heat sink according to one example of the present invention.

While the present invention is capable of embodiment in various forms, there is shown in the drawings and will hereinafter be described a presently preferred embodiment with the understanding that the present disclosure is to be considered as an exemplification of the invention, and is not intended to limit the invention to the specific embodiment illustrated.

Figure 2:
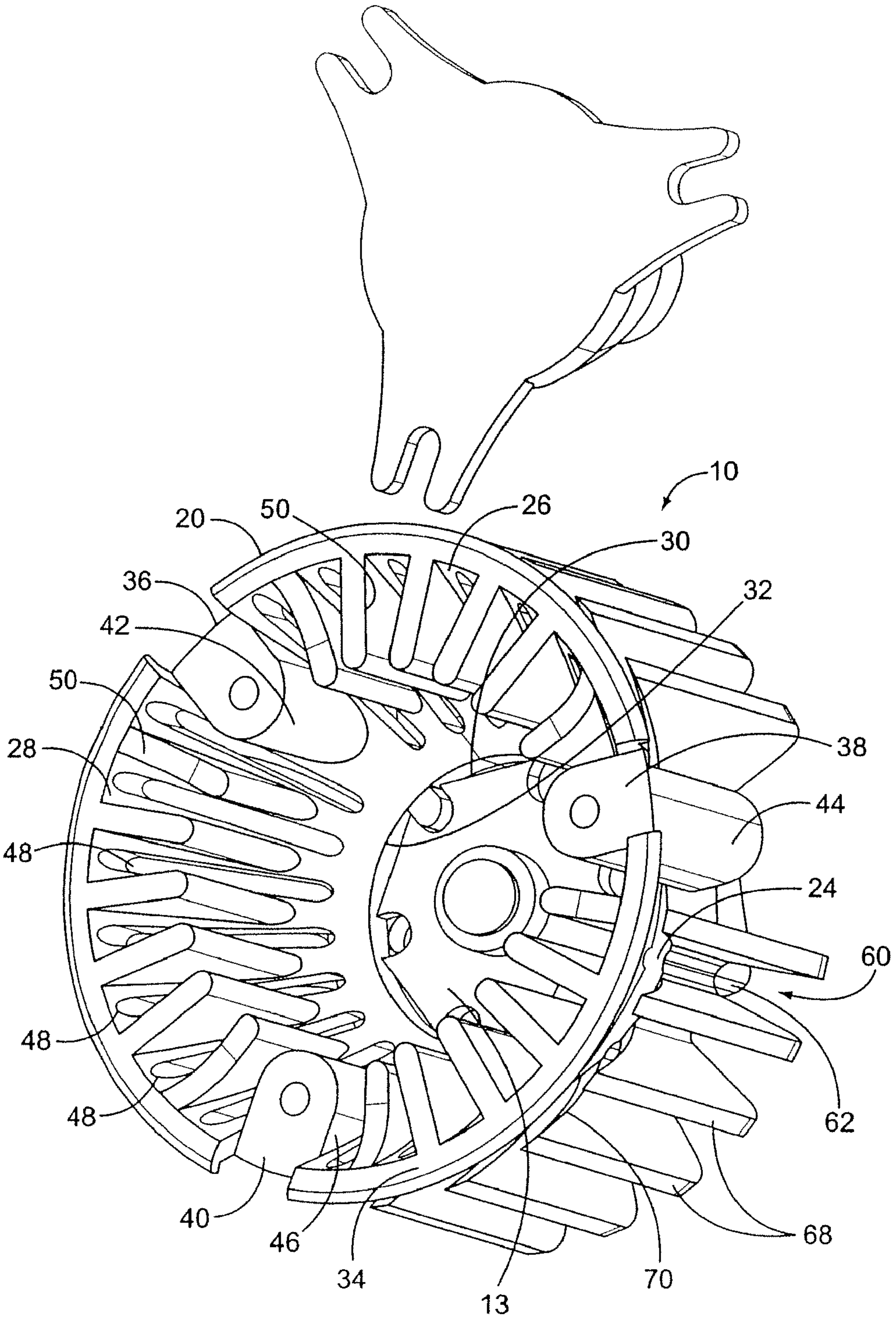
FIG. 2 is a top perspective view of the improved heat sink in FIG. 1.
Figure 3:
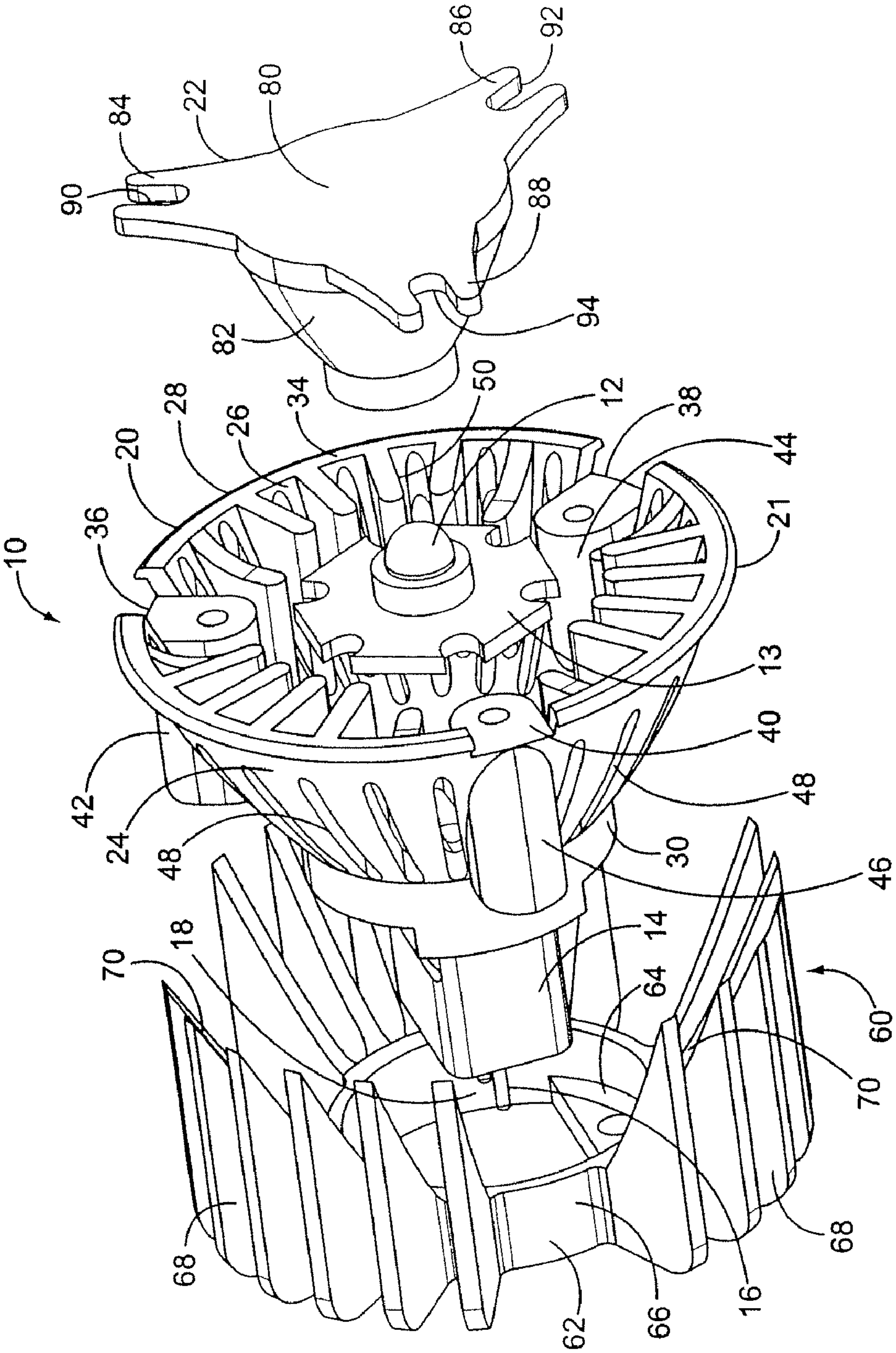
FIG. 3 is an exploded view of the components of the lighting device and heat sink in FIG. 1.

FIGS. 1-3 shows a lighting device 10 which is one example of the present invention. The lighting device 10 is a high output lighting device. The light source of the lighting device 10 is an LED 12 which is any semi-conductor, solid state light source such as a flat LED. The LED 12 will preferably have a lambertian distribution for the widest angle distribution of light. The LED 12 is mounted on a substrate plate 13 which is attached to a base 14 which may be coupled to a power source via two electrical pins 16 and 18. A heat sink 20 holds the LED 12 and the base 14. The heat sink 20 also holds a reflector 22 which is installed over the LED 12 to focus the light emitted from the LED 12.

In this example, the lighting device is a substitute for a known high light output MR-16 halogen lamp which may be used for architectural lamp applications. Of course it is to be understood that this is only an example, and many other lighting applications may utilize the configuration of the heat sink 20.

The heat sink 20 has a generally conically shaped wall 21 with an outer surface 24 and an inner surface 26. An open front end 28 holds the reflector 22 in a fixed position over the LED 12. An opposite cylindrical back end 30 has a mounting aperture 32 which holds the base 14 in place. The open front end 28 is circular in shape and has a rim 34. The rim 34 has a series of three equally spaced notches 36, 38 and 40 which are used to hold the reflector 22. Each of the notches 36, 38 and 40 are placed on a respective column 42, 44 and 46 mounted on the outer surface 24.

The heat sink 20 is typically made from a highly thermally conductive material such as die cast aluminum alloy to conduct and dissipate heat generated from the LED 12. Of course other thermally conductive materials such as copper or thermally conductive plastic may be used to fabricate the heat sink 20. The heat sink 20 is designed to maximize surface area such as outer surface 24 and inner surface 26 in order to increase heat dissipation. The heat sink 20 has slits 48 which are cut from the outer surface 24 and the inner surface 26 between the open front end 28 and the bottom end 30. A multiplicity of radial vanes 50 are mounted on the inner surface 26 between the slits 48 and extend inward. The slits 48 and vanes 50 increase the amount of surface area of the heat sink 20 exposed and thus facilitate heat dissipation.

An optional outer cowling unit 60 may be installed over the outer surface 24 of the heat sink 20 to further increase heat dissipation. The outer unit 60 has a mounting collar 62 which has a tab 64. The collar 62 and tab 64 fit on the cylindrical back end 30 of the heat sink 20. The collar 62 has an outer wall 66 that mounts groups of outer vanes 68 which extend radially from the outer wall 66. The vanes 68 are spaced to provide a gap for each of the columns 42, 44 and 46 of the heat sink 20. The outer vanes 68 are triangularly shaped with lateral surface area and have an angled edge 70 which have the same angle as the outer surface 24 of the heat sink 20. When the outer covering 60 is installed on the heat sink 20, heat is transferred from the heat sink 20 through the collar 62 to the vanes 68 which provide additional surface area to dissipate heat.

The reflector 22 is fabricated from a clear material such as PMMA/plexiglass, glass or plastic. The reflector 22 has a front flat circular surface 80 which is mounted on a conical body 82. Other types materials and shapes such as a metallic cone may be used for the reflector 22. The conical body 82 is shaped to reflect light rays from the LED 12 out through the front surface 80. Three arms 84, 86 and 88 extend from the front surface 80 and fit in the notches 36, 38 and 40 of the heat sink 20. The three arms 84, 86 and 88 each have a slot 90, 92 and 94 respectively. A series of fasteners 96, 98 and 100 hold the reflector 22 to the heat sink 20 through the slots 90, 92 and 94. The fasteners 96, 98 and 100 may be rivets or screws.

With the use of the heat sink 20, the heat generated from the LED 12 may be effectively dissipated via the outer and inner surfaces 24 and 26, the vanes 50 and the slits 48, allowing the LED 12 to be operated at higher power levels and thus may serve as a replacement for Halogen lamp applications without risking failure from excessive heat. Additional heat is dissipated via the cowling 60 through the vanes 68. The LED 12 may also emit different colored lights depending on the semiconductor materials used.

It will be apparent to those skilled in the art that various modifications and variations can be made in the method and system of the present invention without departing from the spirit or scope of the invention. Thus, the present invention is not limited by the foregoing descriptions but is intended to cover all modifications and variations that come within the scope of the spirit of the invention and the claims that follow.

What is claimed is:

1. A high output light emitting diode light source, the light source comprising:

a light emitting diode mounted to a substrate; and a heat sink comprising a base member having electrical connections, a wall having a generally conically shaped portion, the conically shaped portion of the wall having an outer surface, an inner surface, a back end having a mounting aperture for the base member, an opposite open front end, a plurality of openings through the conically shaped portion, and a plurality of vanes extending radially inward from the inner surface, wherein the substrate is attached to the base member.

2. The light source of claim 1 wherein the wall and base member are fabricated from a highly thermally conductive material.

3. The light source of claim 2 wherein the highly thermally conductive material is aluminum.

4. The light source of claim 1 wherein the front end includes a circular rim having a plurality of notches for the mounting of arms attached to a reflector.

5. A high output light emitting diode light source, the light source comprising:

a light emitting diode mounted to a substrate plate; and a heat sink comprising a wall having a generally conically shaped portion, the conically shaped portion having an open front end, a back end opposite the front end and a plurality of openings through the conically shaped portion, wherein the wall is fabricated of a highly thermally conductive material, and a rectangular box-shaped base member having the substrate plate attached thereto.

6. The light source of claim 5, wherein the highly thermally conductive material is aluminum.

7. The light source of claim 5, further comprising a plurality of vanes extending radially inward from an inner surface of the wall.

8. The light source of claim 5 wherein the front end includes a circular rim having a plurality of notches.

9. The light source of claim 5 further comprising a clear reflector placed over the light emitting diode.

10. The light source of claim 5, wherein the base includes two depressions on opposite sides of the base running the full width of the base, parallel to the plane established by the open front end.

11. A high power light emitting diode lamp comprising:

a light emitting diode mounted to a substrate;

a heat sink comprising a base member having electrical connections, a wall having a generally conically shaped portion, the conically shaped portion of the wall having an outer surface, an inner surface, a back end having a mounting aperture for the base member, an opposite open front end, a plurality of openings through the conically shaped portion, and a plurality of vanes extending radially inward from the inner surface; and a clear reflector over the light emitting diode and having a conical body with a front surface with a plurality of arms extending from the surface in contact with the front end of the heat sink.

12. A high power light emitting diode lamp comprising:

a light emitting diode mounted to a substrate plate;

a heat sink comprising a wall having a generally conically shaped portion, the conically shaped portion having an open front end, a back end opposite the front end and a plurality of openings through the conically shaped portion, wherein the wall is fabricated of a highly thermally conductive material, and a rectangular box-shaped base member having the substrate plate attached thereto; and a clear reflector over the light emitting diode and having a conical body with a front surface with a plurality of arms extending from the surface in contact with the front end of the heat sink.

* * * * *